United States Patent
Singh et al.

(10) Patent No.: US 10,672,710 B2
(45) Date of Patent: Jun. 2, 2020

(54) INTERCONNECT STRUCTURES WITH REDUCED CAPACITANCE

(71) Applicant: GLOBALFOUNDRIES INC., Grand Cayman (KY)

(72) Inventors: Sunil Kumar Singh, Mechanicville, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/000,174

(22) Filed: Jun. 5, 2018

(65) Prior Publication Data
US 2019/0371736 A1 Dec. 5, 2019

(51) Int. Cl.
*H01L 23/532* (2006.01)
*H01L 21/768* (2006.01)
*H01L 21/02* (2006.01)
*H01L 23/522* (2006.01)

(52) U.S. Cl.
CPC .. *H01L 23/53295* (2013.01); *H01L 21/02126* (2013.01); *H01L 21/02274* (2013.01); *H01L 21/02282* (2013.01); *H01L 21/76831* (2013.01); *H01L 23/5222* (2013.01); *H01L 23/53223* (2013.01); *H01L 23/53228* (2013.01)

(58) Field of Classification Search
None
See application file for complete search history.

(56) References Cited

U.S. PATENT DOCUMENTS

| | | |
|---|---|---|
| 6,287,979 B1 | 9/2001 | Zhou et al. |
| 6,413,852 B1 | 7/2002 | Grill et al. |
| 6,509,623 B2 | 1/2003 | Zhao |
| 7,135,402 B2 | 11/2006 | Lin et al. |
| 7,361,991 B2 | 4/2008 | Saenger et al. |
| 7,449,407 B2 | 11/2008 | Lur et al. |
| 7,749,891 B2 | 7/2010 | Ueda |
| 8,120,179 B2 | 2/2012 | Chanda et al. |
| 8,241,992 B2 | 8/2012 | Clevenger et al. |
| 8,456,009 B2 | 6/2013 | Su et al. |
| 8,586,447 B2 | 11/2013 | Noguchi et al. |
| 8,642,252 B2 | 2/2014 | Clevenger et al. |
| 9,385,028 B2 | 7/2016 | Nemani et al. |
| 9,780,027 B2 | 10/2017 | Bergendahl et al. |

(Continued)

OTHER PUBLICATIONS

K. Fischer et al, "Low-k Interconnect Stack with multi-layer Air Gap and Tri-Metal-Insulator-Metal Capacitors for 14nm High Volume Manufacturing", vol. 978-1-4673-7356-2/15 © 2015 IEEE, 4 pages.

(Continued)

*Primary Examiner* — Jack S Chen
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to interconnect structures with reduced capacitance and methods of manufacture. The method includes: forming one or more lower metal lines in a dielectric material; forming an airgap structure in an upper dielectric material above the one or more lower metal lines, by subjecting material to a curing process; and forming an upper metal structure above the airgap structure.

9 Claims, 3 Drawing Sheets

(56) References Cited

U.S. PATENT DOCUMENTS

| | | |
|---|---|---|
| 2004/0229454 A1 | 11/2004 | Torres et al. |
| 2004/0232552 A1 | 11/2004 | Wang et al. |
| 2008/0026541 A1 | 1/2008 | Edelstein et al. |
| 2009/0072409 A1 | 3/2009 | Nitta et al. |
| 2009/0091038 A1 | 4/2009 | Chen et al. |
| 2009/0121356 A1 | 5/2009 | Nakagawa |
| 2014/0191401 A1 | 7/2014 | Fischer |
| 2014/0252633 A1* | 9/2014 | Tsai ................ H01L 21/76802 257/773 |

OTHER PUBLICATIONS

S. Natarajan et al, "A 14nm Logic Technology Featuring 2nd Generation FinFET Transistors, Air-Gapped Interconnects, Self-Aligned Double Patterning and a 0.00588um 2 SRAM cell size", vol. 978-1-4799-8001-7/14, 2014 IEEE, 3 pages.

Serkan Kincal et al,"RC Performance Evaluation of Interconnect Architecture Options Beyond the 10-nm Logic Node", IEEE Transactions on Electron Devices, vol. 61, No. 6, Jun. 2014, 6 pages.

* cited by examiner

INTERCONNECT STRUCTURES WITH REDUCED CAPACITANCE

FIELD OF THE INVENTION

The present disclosure relates to semiconductor structures and, more particularly, to interconnect structures with reduced capacitance and methods of manufacture.

BACKGROUND

Signal delay in metal interconnect structures depends on a time constant known as a resistance-capacitance (RC) delay, which is the product of the resistance of a metal line, which electrical current flows and the capacitance between the metal line and neighboring conductive structures. The capacitance is proportional to the effective dielectric constant of the dielectric materials between the metal line and the neighboring conductive structures, as well as the effective area of the capacitive structure including the metal line. Moreover, the capacitance is inversely proportional to the effective distance between the metal line and the neighboring conductive structures.

The effective area of the capacitive structure and the effective distance between the metal line are geometrical factors that depend on the design of a metal interconnect structure. The effective dielectric constant can be decreased by having materials with a low dielectric constant. For example, materials having a low dielectric constant (low-k) materials (i.e., dielectric constant less than about 4) can be used in semiconductor chips. However, parasitic capacitance is still a challenge in future designs as it is harder to reduce the parasitic capacitance per bit line of a static random access memory (SRAM) as chip manufacturing technology improves.

SUMMARY

In an aspect of the disclosure, a method comprises: forming one or more lower metal lines in a dielectric material; forming an airgap structure in an upper dielectric material above the one or more lower metal lines, by subjecting material deposited in a trench of the upper dielectric material to a curing process; and forming an upper metal structure above the airgap structure.

In an aspect of the disclosure, a method comprises: forming lower metal lines within dielectric material; forming an interlevel dielectric material above the lower metal lines; forming at least one trench within the interlevel dielectric material above the lower metal lines; filling the at least one trench with material that is different than the interlevel dielectric material; forming an upper dielectric material over the material; forming at least one airgap structure in the interlevel dielectric material by subjecting the material to a UV curing process; and forming metal structures above the at least one airgap structure.

In an aspect of the disclosure, a structure comprises: a lower metal line within dielectric material; an etch stop layer above the lower metal line; an insulator material above the etch stop layer; a dielectric material above the insulator material; an airgap structure formed in the insulator material, above the etch stop layer and encapsulated by the dielectric material, the airgap structure being in alignment with the lower metal line; and a single damascene interconnect structure above and in alignment with the airgap structure and the lower metal line.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to interconnect structures with reduced capacitance and methods of manufacture. More specifically, the present disclosure provides a method to reduce up and down capacitance in advance back end of line (BEOL) interconnect structures. For example, in embodiments, the interconnect structures are formed over one or more airgap structures within dielectric material. Advantageously, the airgap structures of the present disclosure will provide lower power consumption, lower parasitic capacitance, and faster performance of transistors than conventional semiconductor structures. For example, up/down capacitance can be reduced by almost 50% with a total capacitance reduction of about 17.5%, compared to conventional structures without any airgaps.

The interconnect structures with reduced capacitance of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect structures with reduced capacitance of the present disclosure have been adopted from integrated circuit (IC) technology. For example, the structures are built on wafers and are realized in films of material patterned by photolithographic processes on the top of a wafer. In particular, the fabrication of the interconnect structures with reduced capacitance uses three basic building blocks: (i) deposition of thin films of material on a substrate, (ii) applying a patterned mask on top of the films by photolithographic imaging, and (iii) etching the films selectively to the mask.

Figure 1:
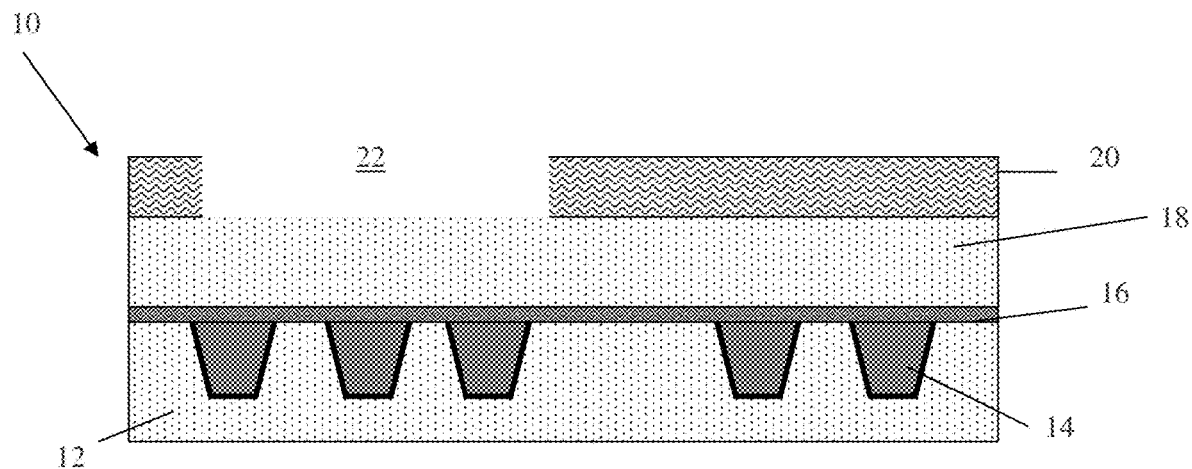
FIG. 1 shows lower wiring lines in a dielectric material, amongst other features, and respective fabrication processes in accordance with aspects of the present disclosure.

FIG. 1 shows a semiconductor structure and respective fabrication processes in accordance with aspects of the present disclosure. More specifically, the structure 10 of FIG. 1 includes lower metal lines 14 within insulator material 12 (e.g., oxide or other dielectric material). In embodiments, the lower metal lines 14 can be fabricated using any conventional CMOS technology, i.e., conventional lithography, etching and deposition methods known to those of skill in the art.

For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known stripants. Following the resist removal, conductive material, e.g., copper, can be deposited by any conventional deposition processes, e.g., electroplating processes. In embodiments, prior to the copper fill, the trench can be lined with a lining material, e.g., TaN and Ta. Any residual material on the surface of the insulator material 30 can be removed by conventional chemical mechanical polishing (CMP) processes.

Still referring to FIG. 1, an etch stop layer 16 is deposited on the insulator material 12 (over the metal lines 14). In embodiments, the etch stop layer 16 can be a nitride material, carbide material or other known etch stop materials. For example, the etch stop layer 16 can be an NBLoK (SiCxNyHz) material. An interlevel dielectric material 18 is deposited on the etch stop layer 16. In embodiments, the interlevel dielectric material 18 is an oxide material deposited using a CVD process. A photomask 20 is formed over the interlevel dielectric material 18, which is exposed to energy to form an opening 22 aligned with selected ones of the lower metal lines 14.

Figure 2:
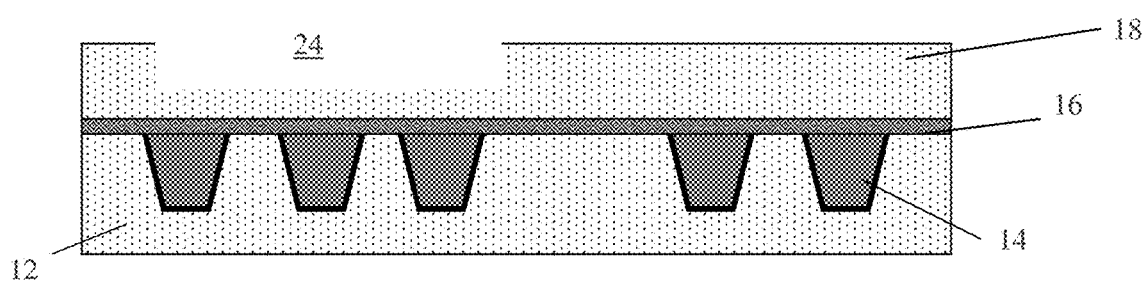
FIG. 2 shows an opening in the dielectric material above the lower wiring lines, amongst other features, and respective fabrication processes in accordance with aspects of the present disclosure.

In FIG. 2, the interlevel dielectric material 18 is subjected to an etching process, e.g., RIE, to form an opening 24 aligned with the selected lower metal lines 14. The etching process will stop on the etch stop layer 16 or, alternatively, slightly provide a recess in the etch stop layer 16. For example, to obtain a lower capacitance value, the etching process can etch slightly into the etch stop layer 16 to form a recess (and hence a larger airgap structure as described herein). In embodiments, the etching process can damage the interlevel dielectric material 18, which will be repaired in subsequent fabrication processes.

Figure 3:
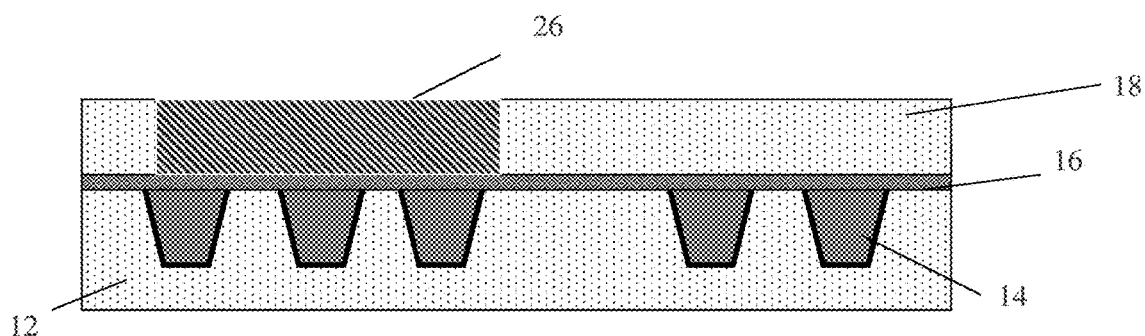
FIG. 3 shows an energy removal film (ERF) in the opening of the dielectric material, amongst other features, and respective fabrication processes in accordance with aspects of the present disclosure.

As shown in FIG. 3, an energy removal film (ERF) 26 is deposited into the opening 24, above the lower metal lines 14. In embodiments, the deposition process can be a CVD process, followed by a planarization process, e.g., CMP. In this way, a top surface of the ERF 26 will be planar with the top surface of the interlevel dielectric material 18. In embodiments, the thickness of the ERF 26 can be about 20 nm to about 30 nm; although other dimensions are contemplated herein. The ERF 26 can be any material that is removable when subjected to a UV curing process. For example, the ERF 26 can be a carbon based material. In more specific embodiments, the ERF 26 can be atom transfer radical polymerization (ATRP) and bicycloheptadiene (BCHD). The ERF material 26 can be decomposable upon being exposed to energy such as ultraviolet (UV), X-ray, infrared, visual light, thermal energy, electron-beam (e-beam), and/or other proper energy sources.

Figure 4:
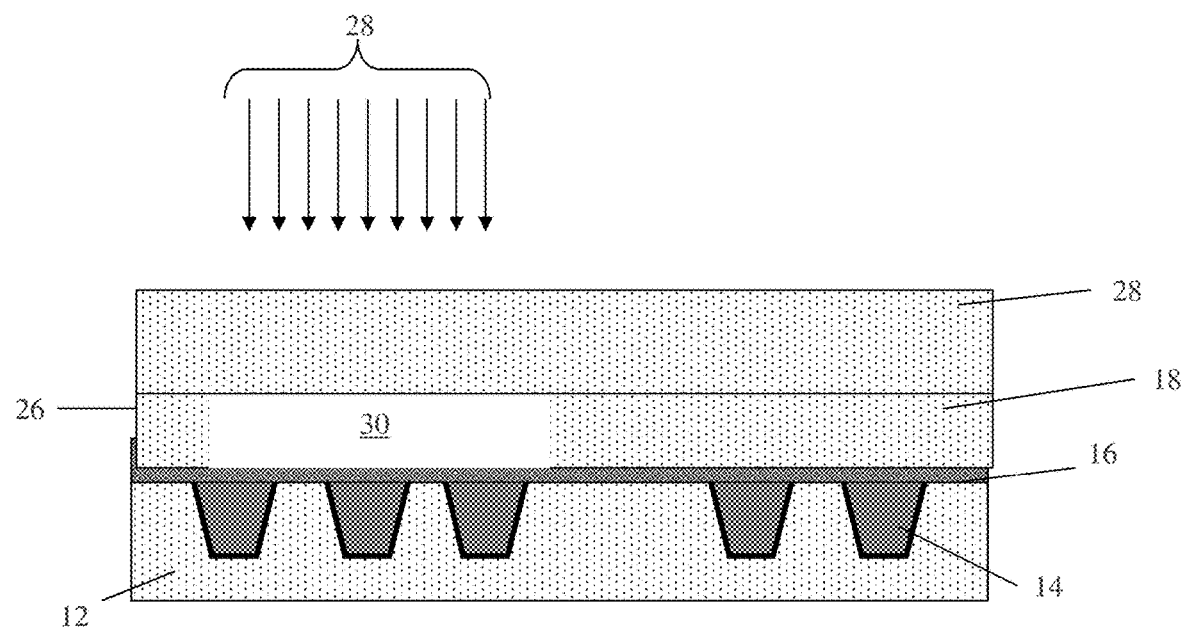
FIG. 4 shows an airgap structure above the lower wiring lines, amongst other features, and respective fabrication processes in accordance with aspects of the present disclosure.

Referring now to FIG. 4, an interlevel dielectric material 28 is formed over the interlevel dielectric material 18. In embodiments, the interlevel dielectric material 28 can be the same material as the interlevel dielectric material 18. Alternatively, the interlevel dielectric material 28 can be an ultra, low-k dielectric material. In embodiments, the interlevel dielectric material 28 can be deposited by a conventional CVD process.

Following the deposition of the interlevel dielectric material 28, the structure then undergoes an UV curing process (as represented at reference numeral 29) to remove the ERF material, resulting in airgap 30. In preferred embodiments, the UV curing process will completely remove the ERF material. As an example, the UV curing process is performed at a temperature of about 350° C. to about 400° C. for about 2 to 5 minutes. The UV wavelength can be any UV wavelength that will remove the particular ERF material used in the structure, e.g., in the 240 nm-270 nm and 350-380-nm. In embodiments, the UV curing process will not only remove the ERF material, but it will also remove the porogens from the interlevel dielectric material 28. In addition, the UV curing will repair any damage to the interlevel dielectric material 18 caused by the previous etching process.

Figure 5:
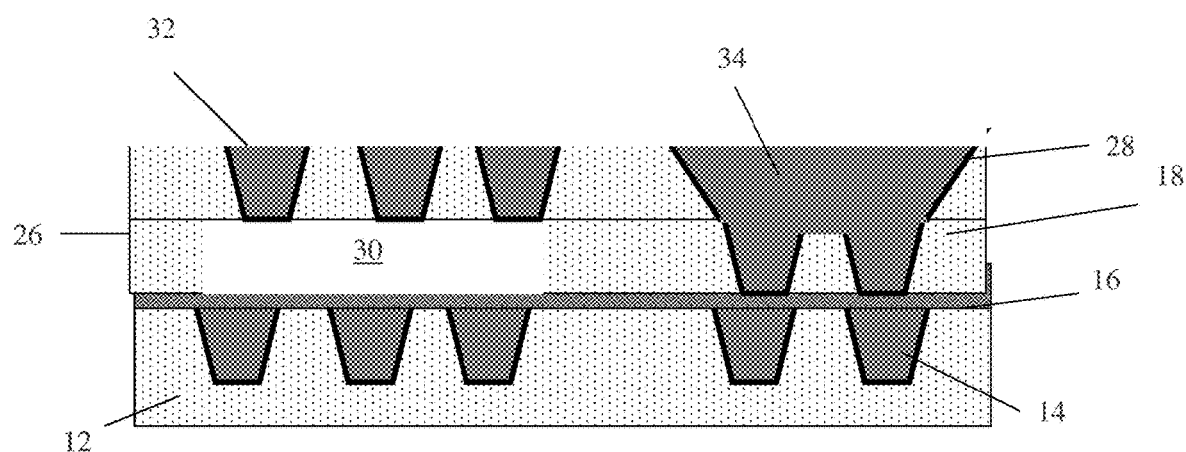
FIG. 5 shows upper wiring lines above the airgap structure, amongst other features, and respective fabrication processes in accordance with aspects of the present disclosure.

In FIG. 5, upper metal structures (e.g., interconnects and/or metal wirings) 32, 34 are formed in the interlevel dielectric material 28. By way of example, the upper metal structures 32, e.g., interconnects, are formed over the airgap 30 and in alignment with the lower metal lines 14 (e.g., interconnects and/or metal wirings) using a single damascene process; whereas, the upper metal structures 34 are formed by a dual damascene process, in direct contact with the underlying metal lines 14. In embodiments, the dual damascene process can be two single damascene processes. The single and dual damascene processes are conventional CMOS processes, e.g., lithography, etching and deposition processes, such that no further explanation is required for an understanding of the present disclosure.

Figure 6:
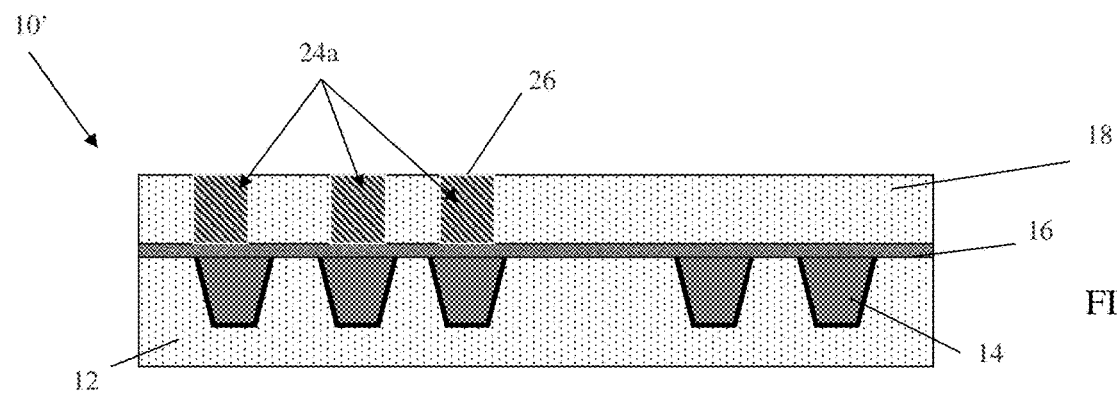
FIGS. 6-8 show an alternative airgap structure above the lower wiring lines, amongst other features, and respective fabrication processes in accordance with additional aspects of the present disclosure.
Figure 7:
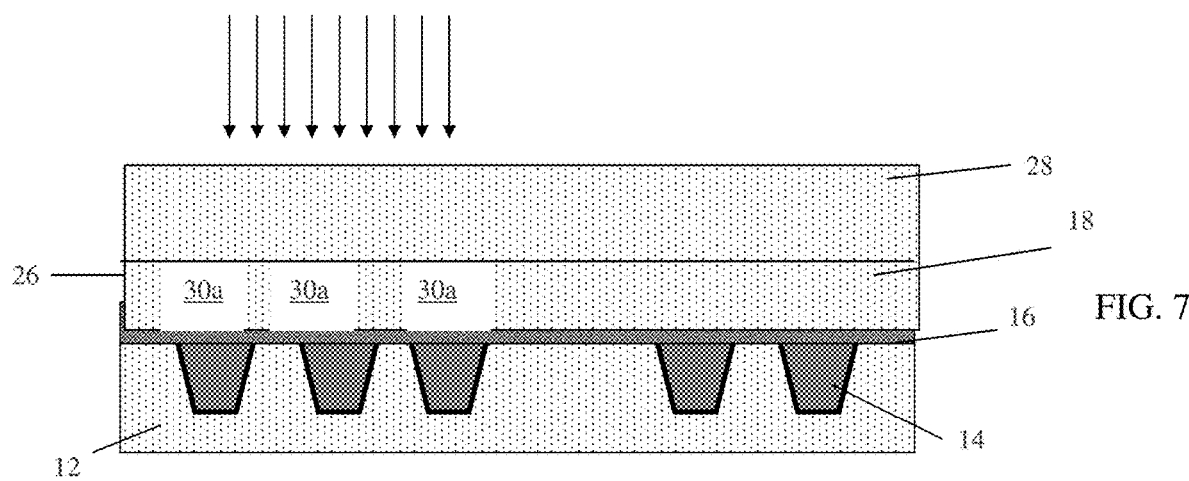
Figure 8:
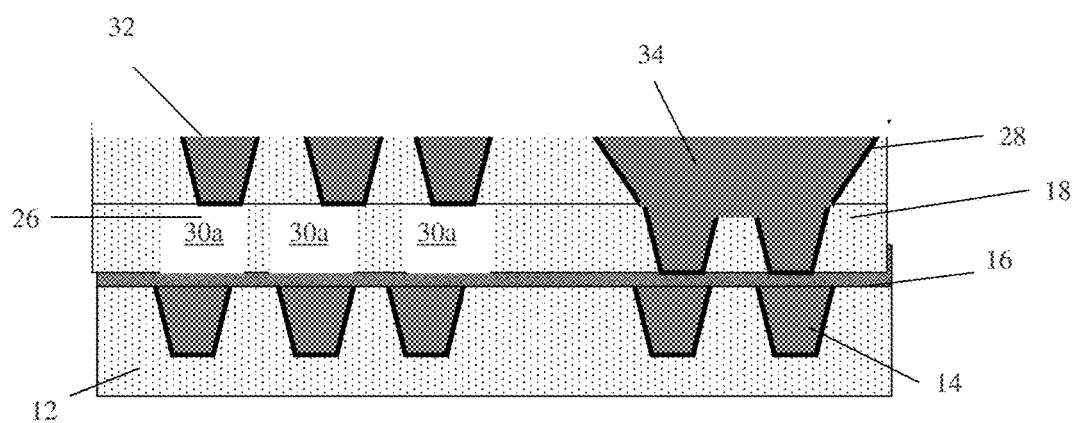

FIGS. 6-8 show an alternative airgap structure above the lower wiring lines, amongst other features, and respective fabrication processes in accordance with additional aspects of the present disclosure. More specifically, as shown in FIG. 6, the structure 10' includes a plurality of openings 24a formed in the interlevel dielectric material 18, each aligned with a respective lower metal line 14. In embodiments, the plurality of openings 24a are formed by lithography and etching processes, as already described herein. The plurality of openings 24a are then filled with the ERF material 26, followed by a planarization process, e.g., CMP, to be planar with a surface of the interlevel dielectric material 18. The thickness of the ERF material 26 is about 20 nm to about 30 nm; although other dimensions are also contemplated herein.

In FIG. 7, an interlevel dielectric material 28 is deposited over the interlevel dielectric material 18, encapsulating the ERF material 26 in the plurality of openings 24a. In embodiments, the interlevel dielectric material 28 can be the same material as the interlevel dielectric material 18. Alternatively, the interlevel dielectric material 28 can be an ultra, low-k dielectric material. In embodiments, the interlevel dielectric material 28 can be deposited by a conventional CVD process.

Following the deposition of the interlevel dielectric material 28, the structure then undergoes an UV curing process to remove the ERF material, resulting in a plurality of airgaps 30a aligned with the underlying metal lines 14. As previously noted, the UV curing process can be performed at a temperature of about 350° C. to about 400° C. for about 2 to 5 minutes. The UV wavelength can be any UV wavelength that will remove the ERF material.

In FIG. 8, upper metal structures (e.g., interconnects and/or metal wiring lines) 32, 34 are formed in the interlevel dielectric material 28. By way of example, the upper metal structures (e.g., interconnects) 32 are formed over the airgaps 30a and in alignment with the lower metal lines 14 (using a single damascene process); whereas, the upper metal structures 34 are formed by a dual damascene process, in direct contact with the underlying metal lines 14. In embodiments, the dual damascene process can be two single damascene processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming one or more lower metal lines in a dielectric material;
   forming an upper dielectric material above the one or more lower metal lines;
   etching portions of the upper dielectric material to form a trench;
   depositing material in the trench;
   encapsulating the material by depositing another inter-level dielectric material over the material which is deposited within the trench;
   forming an airgap structure in the upper dielectric material above the one or more lower metal lines, by subjecting the encapsulated material deposited in the trench of the upper dielectric material to a curing process; and
   forming an upper metal structure above the airgap structure.

2. The method of claim 1, wherein the curing process is a UV cure and the material is an energy removal film.

3. The method of claim 2, wherein the energy removal film is a carbon based film.

4. A method, comprising:
   forming one or more lower metal lines in a dielectric material;
   forming an upper dielectric material above the one or more lower metal lines;
   etching portions of the upper dielectric material to form a trench;
   depositing material in the trench;
   forming an airgap structure in the upper dielectric material above the one or more lower metal lines, by subjecting the material deposited in the trench of the upper dielectric material to a curing process; and
   forming an upper metal structure above the airgap structure,
   wherein the forming of the airgap structure is formed as a single airgap structure in alignment with at least one of the one or more lower meal lines and the upper metal structure, and
   wherein the curing process is a UV cure and the material is an energy removal film.

5. The method of claim 2, wherein the airgap structure is a plurality of airgap structures aligned with at least one of the one or more lower metal lines and the upper metal structure.

6. The method of claim 2, wherein the UV curing process is provided at a temperature range of about 350° C. to about 400° C. for about 2 to 5 minutes.

7. The method of claim 1, wherein the etching of the trench damages the upper dielectric material, and a UV curing process repairs the etch damage to the upper dielectric material caused by forming the trench.

8. The method of claim 1, further comprising forming an etch stop layer above the one or more lower metal lines, wherein the forming of the trench is an etching process which stops or slightly recesses the etch stop layer above the one or more lower metal lines.

9. The method of claim 1, wherein the upper metal structure is an interconnect structure.

* * * * *